United States Patent [19]

Lepping

[11] Patent Number: 5,598,438
[45] Date of Patent: Jan. 28, 1997

[54] CORDLESS TELECOMMUNICATION APPARATUS

[75] Inventor: Jürgen Lepping, Essen, Germany

[73] Assignee: Siemens Aktiengesellschaft, Munich, Germany

[21] Appl. No.: 428,142

[22] PCT Filed: Oct. 12, 1993

[86] PCT No.: PCT/DE93/00971

§ 371 Date: May 1, 1995

§ 102(e) Date: May 1, 1995

[87] PCT Pub. No.: WO94/10783

PCT Pub. Date: May 11, 1994

[30] Foreign Application Priority Data

Oct. 30, 1992 [DE] Germany ............... 42 36 774.3

[51] Int. Cl.$^6$ ............................................. H04L 25/06
[52] U.S. Cl. ................... 375/317; 315/324; 315/355; 327/72; 327/307
[58] Field of Search ............................ 375/316, 317, 375/324–328, 344–345, 355, 364–365; 327/307, 72

[56] References Cited

U.S. PATENT DOCUMENTS

| | | | |
|---|---|---|---|
| 4,125,812 | 11/1978 | Polonio | 375/317 |
| 4,387,465 | 6/1983 | Becker | 375/317 |
| 4,588,905 | 5/1986 | Kojima . | |
| 4,672,596 | 6/1987 | Romeas et al. . | |
| 4,686,385 | 8/1987 | Sharpe . | |
| 5,463,408 | 11/1994 | Paik et al. | 375/354 |

FOREIGN PATENT DOCUMENTS

| | | |
|---|---|---|
| 0063443 | 10/1982 | European Pat. Off. . |
| 0124166 | 11/1984 | European Pat. Off. . |
| 0133067 | 2/1985 | European Pat. Off. . |
| 2238922 | 6/1991 | United Kingdom . |

OTHER PUBLICATIONS

Japanese Abstract, vol. 12, No. 232 (E–628) (3079), 30 Jun. 1988, JP 63–23413.

A. Mann, "DER GSM–Standard—Grundlage für digitale europaische Mobilfunknetze", Informatik Spektrum, 8350, 14 Jun. 1991, No. 3, pp. 137–152.

R. J. Mulder, "DECT, a universal cordless access system", Philips Telecommunication Review, vol. 49, No. 3, Sep. 1991, pp. 68–73.

Research Disclosure, 2244, No. 309, Jan. 1990, New York(US), S. 18, Normen Nescio "On Chip Clock Receiver Circuit".

Primary Examiner—Stephen Chin
Assistant Examiner—Thuy L. Nguyen
Attorney, Agent, or Firm—Hill, Steadman & Simpson

[57] ABSTRACT

For the demodulation of modulated carrier signals (AS) supplied to the cordless telecommunication apparatus, a data comparator (1212) is used in the cordless information transmission, especially a DECT-specific information transmission, which data comparator is supplied for this purpose with a reference signal (RS) generated by integration of the carrier signal (AS) at an input (E2) for the purpose of demodulating the carrier signal (AS). Since, according to the DECT transmission convention, two identical bit values of a synchronization word (S-BW) must also be detected in addition to the demodulation, a decision threshold (ES) of the reference signal (RS) is changed by an error value (dES). In the cordless telecommunication apparatus, a compensation arrangement (16, 19, 142) which compensates for this error value (dES) is therefore additionally provided.

7 Claims, 6 Drawing Sheets

CORDLESS TELECOMMUNICATION APPARATUS

BACKGROUND OF THE INVENTION

1. Field of the Invention

The invention relates to a cordless telecommunication apparatus conversion means for converting an analog RF signal into a digital data stream and having synchronization means for synchronizing the data stream with respect to an apparatus clock, characterized in that the conversion means comprise comparator means which compare the RF signal with a reference signal generated from the former by means of integration and generate the data stream in accordance with the result of the comparison, and in that detection means are provided which, in the case of the first succession of two identical bit values of the synchronized data stream, control the comparator means in such a manner that the integration of the RF signal is interrupted and the integration of the RF signal sections corresponding to the two successive bit values is compensated for.

2. Description of the Related Art

The technical development of communication systems that include cordless telecommunication apparatuses for the cordless transmission of voice and non-voice information is tied to various standards, analogously to the ISDN standard (Integrated Services Digital Network) which has existed for some time in line-connected communications. Apart from some national standards and several cross-boundary standards such as the CT1, CT1+ standard on an analog basis and the CT2, CT3 standard on a digital basis, a standard, the so-called DECT standard (Digital European Cordless Telecommunication; compare European Telecommunication Standard—Final Draft—, prETS 300 175-1 . . . 9, 5/1992, ETS Institute 06921 Sophia Antipolis, France and Philips Telecommunication Review, Vol. 49, No. 3, 9/1991, pages 68 to 73, "DECT, a universal cordless access system" by R. J. Mulder), analogous to the global GSM standard (Group Spéciale Mobile or Globals Systems for Mobile Communication; compare Informatik Spektrum Vol. 14, No. 3, 6/1991, pages 137 to 152, "Der GSM—Standard—Grundlade für digitale europäische Mobilfunknetze") (The GSM Standard—Basis for Digital European Mobile Radio Networks) by A. Mann) for mobile radio, has been created on a European scale for the lower-power cordless communication between portables and a base station, with ranges of some 100s of meters. It is an essential feature of the DECT standard that the base station can be connected to line-connected communication networks (e.g. PSTN=Public Switched Telephone Network; PTN=Private Telecommunication Network).

Figure 1:
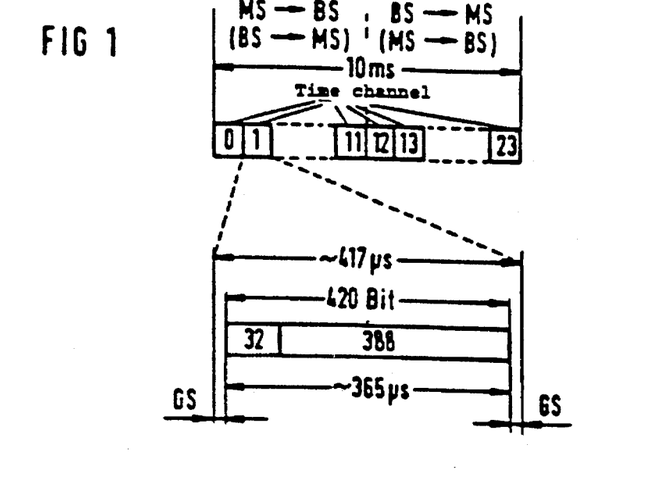
FIG. 1 is a schematic diagram of a time division multiplex frame of a predetermined time duration.

For cordless communication according to the DECT standard, a dynamic channel selection of approximately 120 available channels is carried out. The 120 channels result from the fact that in the DECT standard, ten frequency bands between 1.8 and 1.9 GHz are used, a time-division multiplex frame of 10 ms being used in time-division multiplex access (TDMA) in each frequency band according to the representation in FIG. 1. In this time-division multiplex frame, 24 time channels (from 0 to 23) are defined, which provide a frame structure. This frame structure is then used in such a manner that for each frequency band, 12 mobile stations MS with a base station BS of a DECT communication system can operate simultaneously in duplex mode (MS-BS and BS-MS or, respectively, BS-MS and MS-BS). A time slot of in each case 417 µs is allocated to the 24 time channels. This time slot specifies the time in which information (data) are transmitted. This type of transmitting information in duplex mode is also called the ping-pong method because transmission takes place at a particular time and reception takes place at another time. In this ping-pong method, one time frame or pulse (burst) of 365 µs is transmitted in each time slot, which approximately corresponds to a frame length of 420 bits, with a data throughput of 42 kbit/s. Taking into consideration that in each case 30 bits are available in a guard space at both ends of the time frame in order to avoid overlaps by adjoining time slots, this results in a total data throughput of 1,152 MBit/s referred to the time-division multiplex frame.

Figure 2:
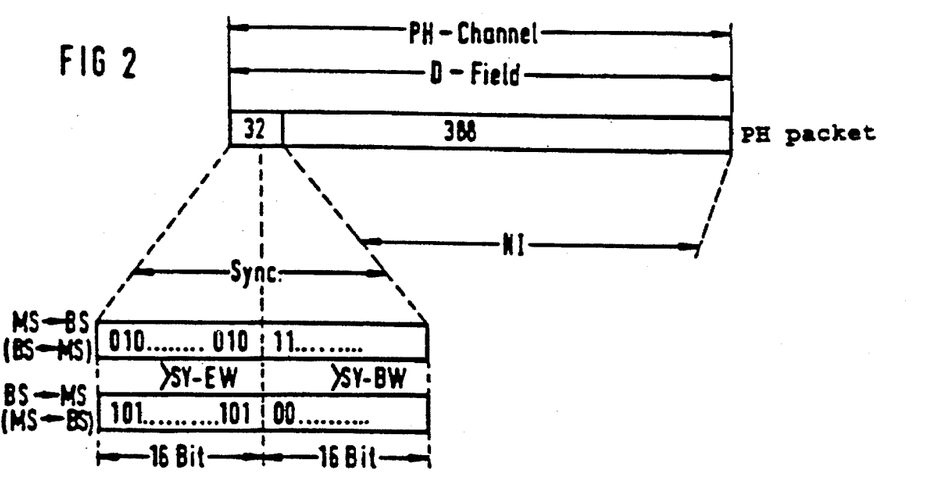
FIG. 2 is a schematic diagram of a data packet referred to as a physical (PH) channel.

According to FIG. 2, the succession in time of the pulses transmitted per time-division multiplex frame defines a PH channel, the so-called PHysical channel which is allocated to a so-called PHysical layer (PH-L). The data packet of 420 bits transmitted in this channel is called the PH packet and allocated to a D field. Of the 420 data bits (sequence of H/L bit values) in the PH packet, 32 bits are used for synchronization and 388 bits are used for transmitting net information (NI). The 32 bits for the synchronization are subdivided, in turn, into two data bit sequences of in each case 16 bits. The first data bit sequence (sequence with the first 16 H/L bit values) is a synchronization initiation word SY-EW by means of which the synchronization is initiated. In the ideal case, this synchronization initiation word SY-EW consists of a periodic "101" or "HLH" sequence for a "mobile station MS-base station BS" direction of transmission" and of an also periodic "010" or "LHL" sequence for the reverse "base station BS-mobile station MS" direction of transmission. The bracketed allocations are alternative allocations depending on what sequence is allocated to which direction of transmission.

The second data bit sequence (sequence with the second 16 H/L bit values) is a synchronization confirmation word SY-BW, with which the synchronization initiated with the synchronization initiation word SY-EW must be confirmed. In this confirmation, the synchronization confirmation word SY-BW must be almost, i.e. essentially every data bit, recognized. The synchronization initiated with the synchronization initiation word SY-EW is only accepted when this is so. In this arrangement, synchronization is initiated when it can be assumed with a certain probability that the synchronization initiation word SY-EW is a "HLH" or "LHL" sequence.

Figure 3:
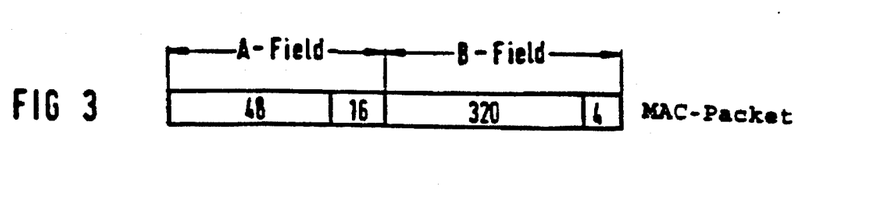
FIG. 3 is schematic diagram of a data packet referred to as a Medium Access Control packet, FIG. 4 i s a schematic diagram of a cordless communication arrangement including a mobile station and a base station.

In addition, yet more layers are defined in the DECT standard, analogously to the ISDN standard with the ISO/OSI 7-layer model. One of these layers is a Medium Access Control Layer (MAC-L) which was allocated the 388 bits for the transmission of the net information in an A field and in a B field according to FIG. 3. The A field here comprises 64 bits which, inter alia, are used for messages when joining the base and mobile stations of the DECT communication system. The remaining 324 bits of the B field, 320 bits of which are used for voice data and 4 bits for detecting partial interferences of the pulse, are allocated to other ISO/OSI layers.

In its simplest form, the DECT communication system has a base station with at least one mobile station. More complex (e.g. networked) systems contain several base stations having in each case several mobile stations. Due to the 24 time channels defined in the DECT standard, up to 12 mobile stations can be allocated to the base station, which communicate with the base station in duplex mode. For the time-division multiplex frame of 10 ms, also defined in the DECT standard, duplex mode means that information is transmitted every 5 ms from the base station to a mobile station or conversely.

Figure 4:
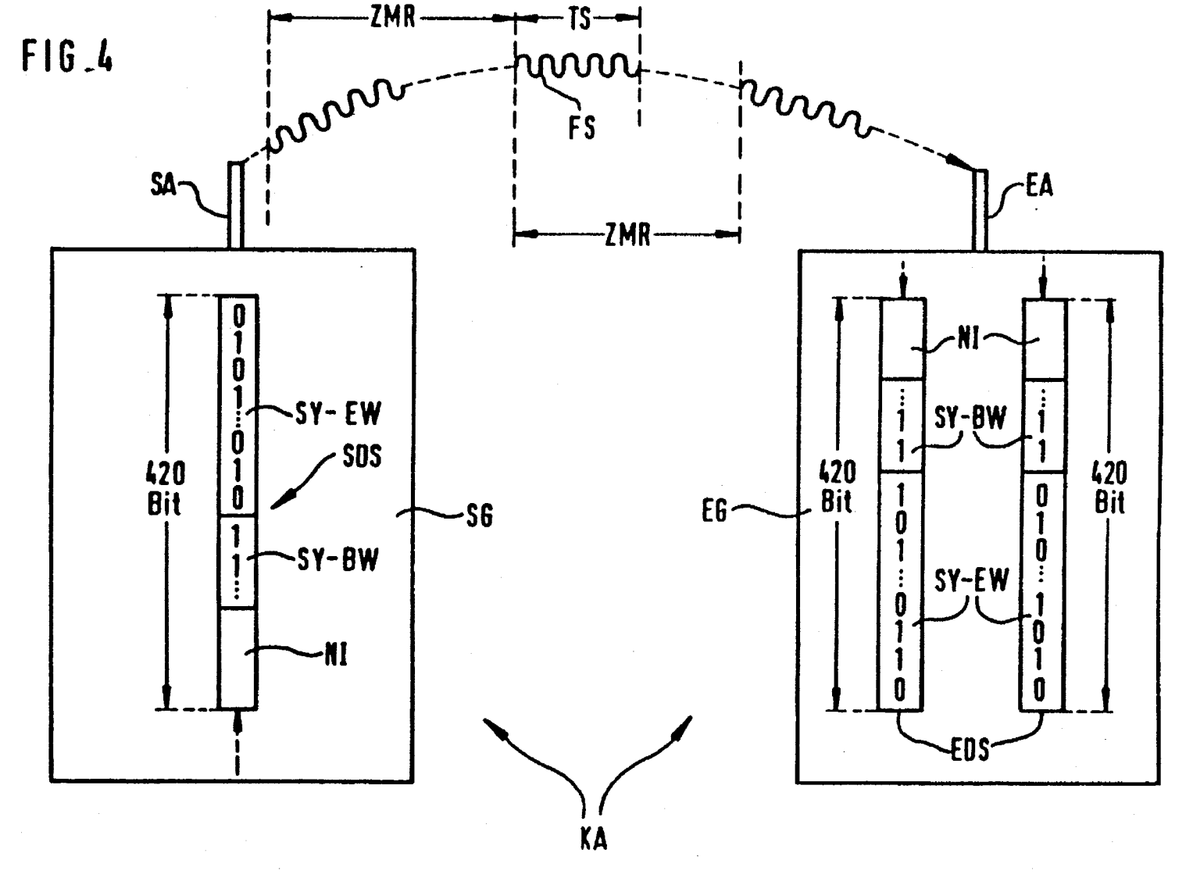

FIG. 4 shows a cordless communication arrangement KA which is typical of DECT communication systems and in which the mobile station MS is used as a transmitter SG and the base station BS is used as a receiver EG. On the basis of the above information, the cordless communication arrangement KA can also be modified to the extent that the base station BS is used as the transmitter SG and the mobile station MS is used as the receiver EG. The transmitter SG has a transmitting antenna SA via which a radio signal FS generated by the transmitter SG is sent to the receiver EG. To be able to receive the radio signal FS, the receiver EG has a receiving antenna EA.

According to the DECT transmission convention forming the basis of the DECT communication system, the radio signal FS is a radio-frequency carrier signal with a carrier frequency between 1.8 and 1.9 GHz which is modulated with a digital transmitted data stream SDS present in the transmitter SG with a transmitter-specific clock (phase). The digital data stream present in the transmitter SG contains the information required for the cordless transmission. This information includes, inter alia, the abovementioned synchronization and net information which, according to the DECT standard, is contained, for example, in an information packet (PH packet) of 420 bits. Using this information or data packet, the modulated radio signal FS (carrier signal) is then generated in the transmitter SG and transmitted at regular time intervals, predetermined by the time-division multiplex frame ZMR, for a period predetermined by the time slot in accordance with the DECT transmission convention.

To be able to decode the transmitted information packet (transmitted voice information per time slot TS), the radio signal FS (modulated carrier signal) must be demodulated in the receiver EG. After demodulation, a digital received data stream EDS is produced in the receiver EG, which data stream, in the event of an error-free transmission of the radio signal FS, has the same bit structure as the transmitted data stream SDS (right-hand received data stream EDS) and which has a different bit structure (left-hand received data stream) from the transmitted data stream in the case of a transmission of the radio signal with errors.

For this demodulation, an analog/digital converter is used in a familiar manner, in accordance with the GSM standard in the case of mobile transceivers. This analog/digital converter samples an analog signal bit by bit with an adjustable sampling rate. However, since these analog/digital converters are quite expensive, there is an interest in less inexpensive solutions for the demodulation of modulated analog signals in a cordless telecommunication apparatus in many areas of cordless telecommunication technology (for example in the transmission of voice signals). From the British Patent reference GB-2 238 922 A, a cordless telephone is known which exhibits conversion means for converting an analog RS signal into a digital data stream and synchronization means for synchronizing the data stream with respect to an apparatus clock.

From the European Patent reference EP-0 124 166 A2, a wave shape converter circuit is known which generates from a frequency-modulated sinusoidal analog signal with varying "peak-peak" amplitude values and direct-voltage potential values a square wave signal having a uniform (constant) pulse duty ratio. For this purpose, the converter circuit includes an analog/digital comparator, at the inverting input of which the analog signal is present and at the noninverting input of which a reference signal generated from the analog signal by integration is present. The square wave signal present at the output of the analog/digital comparator is fed back via a D-type flip flop and filters following it at the output back to the inputs of the analog/digital comparator in such a manner that the pulse duty ratio of the square wave signal is constant with an analog signal which changes with respect to the direct-voltage potential values.

From the European Patent reference EP-0 133 067 A1, a device for regenerating a readout signal from optical storage diskettes is known which exhibits a deformation circuit following a readout processor for correcting a readout clock signal. The deformation circuit is constructed as a phase monitoring loop for which a switched integrator circuit and a comparator are used.

SUMMARY OF THE INVENTION

It is the object of the invention to provide a cordless telecommunication apparatus in which a digital data stream generated from an analog received radio signal is synchronized for identical conditions of synchronization with respect to an apparatus clock immediately before and after the initial occurrence of two identical successive bit values of the data stream. This and other objects and advantages of the invention are achieved by a cordless telecommunication apparatus comprising conversion means for converting an analog RF signal into a digital data stream and having synchronization means for synchronizing the data stream with respect to an apparatus clock, characterized in that the conversion means comprise comparator means which compare the RF signal with a reference signal generated from the former by means of integration and generate the data stream in accordance with the result of the comparison, and in that detection means are provided which, in the case of the first succession of two identical bit values of the synchronized data stream, control the comparator means in such a manner that the integration of the RF signal is interrupted and the integration of the RF signal sections corresponding to the two successive bit values is compensated for.

The technical features of the subject matter of the invention characterize a cordless telecommunication apparatus in which, instead of the previously known analog/digital converter for demodulating modulated analog signals, a data comparator can be used which is also suitable for this purpose but is less expensive in comparison with the analog/ digital converter. In addition, using the data comparator has the advantage that it is no longer necessary to carry out as many control and monitoring procedures in the cordless telecommunication apparatus.

Advantageous further developments of the invention are characterized in that the comparator means is an analog/ digital comparator which is supplied with the RF signal at a first input and via a switching device, a compensation circuit and an integration circuit at a second input, and the output of which is connected to the synchronization means.

In preferred embodiments, the cordless telecommunication apparatus has the integration circuit constructed as a parallel RC circuit connected to ground. The switching device and compensation circuit are controlled by the detection means. The compensation circuit preferably includes a compensation capacitor.

The cordless telecommunication apparatus is used as a base station in a DECT communication system, and preferably as a mobile station in a DECT communication system.

BRIEF DESCRIPTION OF THE DRAWINGS

An exemplary embodiment of the invention will be explained in further detail with reference to the drawings, using FIGS. 5 to 10. In the figures.

DETAILED DESCRIPTION OF THE PREFERRED EMBODIMENTS

Figure 5:
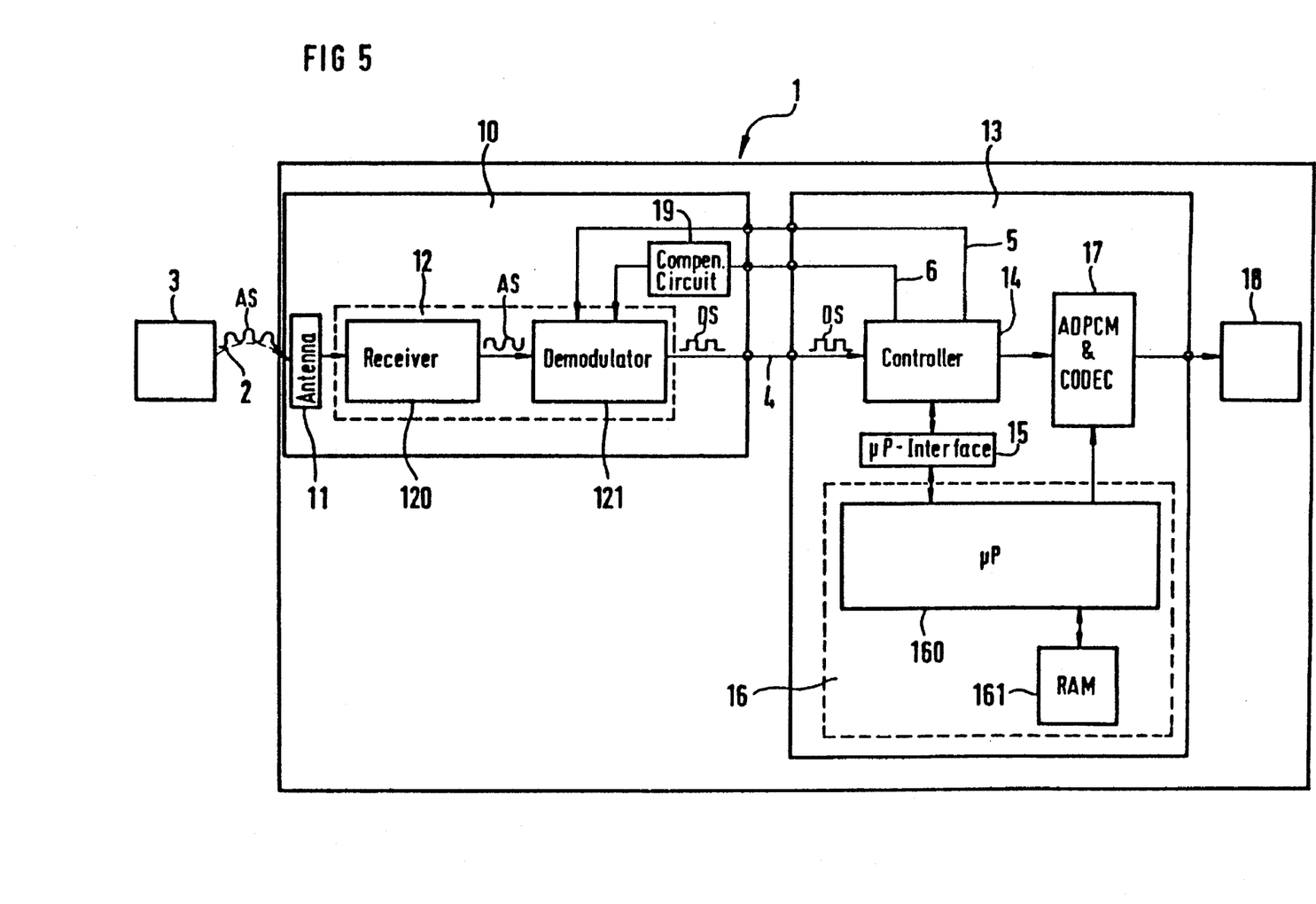
FIG. 5 shows a block diagram of the basic configuration of a cordless telecommunication apparatus having a receiving section and a digital section.

FIG. 5 shows a block diagram of the configuration of a cordless telecommunication apparatus 1 which can be used, for example, as a base station or mobile station in a cordless communication system, especially one defined in accordance with the DECT standard. The cordless telecommunication apparatus 1 is associated with, inter alia, a receiving section 10 for receiving analog RF signals AS modulated for the information transmission, a digital section 13 for evaluating and further processing of a digital data stream DS demodulated from the respective RF signal AS, and a peripheral section 18 for outputting or forwarding the information transmitted with the aid of the RF signal AS and the digital data stream DS.

Using an antenna 11 as a radio interface, the receiving section 10 of the cordless telecommunication apparatus is connected to a transmitter 3 transmitting the RF signal AS via a radio link 2. The antenna 11 is followed by a receiver 12 with a receiving circuit 120 (receiver) and a demodulation circuit 121 (demodulator). The receiving circuit 120 is constructed in a conventional manner and conditions the modulated analog RF signal AS received by the antenna 11 for the demodulation in the demodulation circuit 121. During this demodulation of the RF signal AS, the digital data stream DS is produced at the output of the demodulation circuit 121. The configuration of the demodulation circuit 121 and generation of the digital data stream DS is explained in the description of FIGS. 6, 7, 8, 9 and 10. The digital data stream DS generated by the demodulation circuit 121 is transmitted from the receiving section 10 to a control device 14 of the digital section 13 via a data line 4 with a data throughput of up to 1.152 MBit/s (Mega Baud).

This high transmission rate makes high demands especially on the control device 14 which controls all procedures and sequences required for the evaluation and further processing of the digital data stream DS in the digital section 13.

Among others, it is the demodulation circuit 121 which is connected directly to the control device 14 via a first control line 5 and indirectly via a compensation circuit 19 of the receiving section 10 via a second control line 6, which is affected by being controlled by the control device 14.

The control device 14 which, in particular, carries out the synchronization of the digital section 13 to the demodulated data stream DS and the switching of connections in the TDMA process with the reception of the digital data stream DS, is in turn allocated to a microprocessor arrangement 16 via a bus interface 15. The microprocessor arrangement 16 contains a microprocessor 160 and a digital memory 161 which is connected to the microprocessor 160. The microprocessor arrangement 16 is responsible for all control and programming sequences in the cordless telecommunication apparatus 1. Thus, for example, the control chip 14 is indirectly programmed by the microprocessor arrangement 16 via the bus interface 15.

In addition, the microprocessor arrangement 16 controls an ADPCM and CODEC circuit 17. The ADPCM and CODEC circuit 17 performs an interface function between the control device 14 and the peripheral section 18 of the cordless telecommunication apparatus 1. For this interface function, the ADPCM and CODEC circuit 17 is also partially controlled by the control device 14 as well as the microprocessor arrangement 16. The peripheral section 18 includes, especially, those devices of the cordless telecommunication apparatus 1 which, for example, convert the digital data stream DS processed by the digital section 13, after D/A conversion, into acoustic signals or forward it to an external analog communication network.

Figure 6:
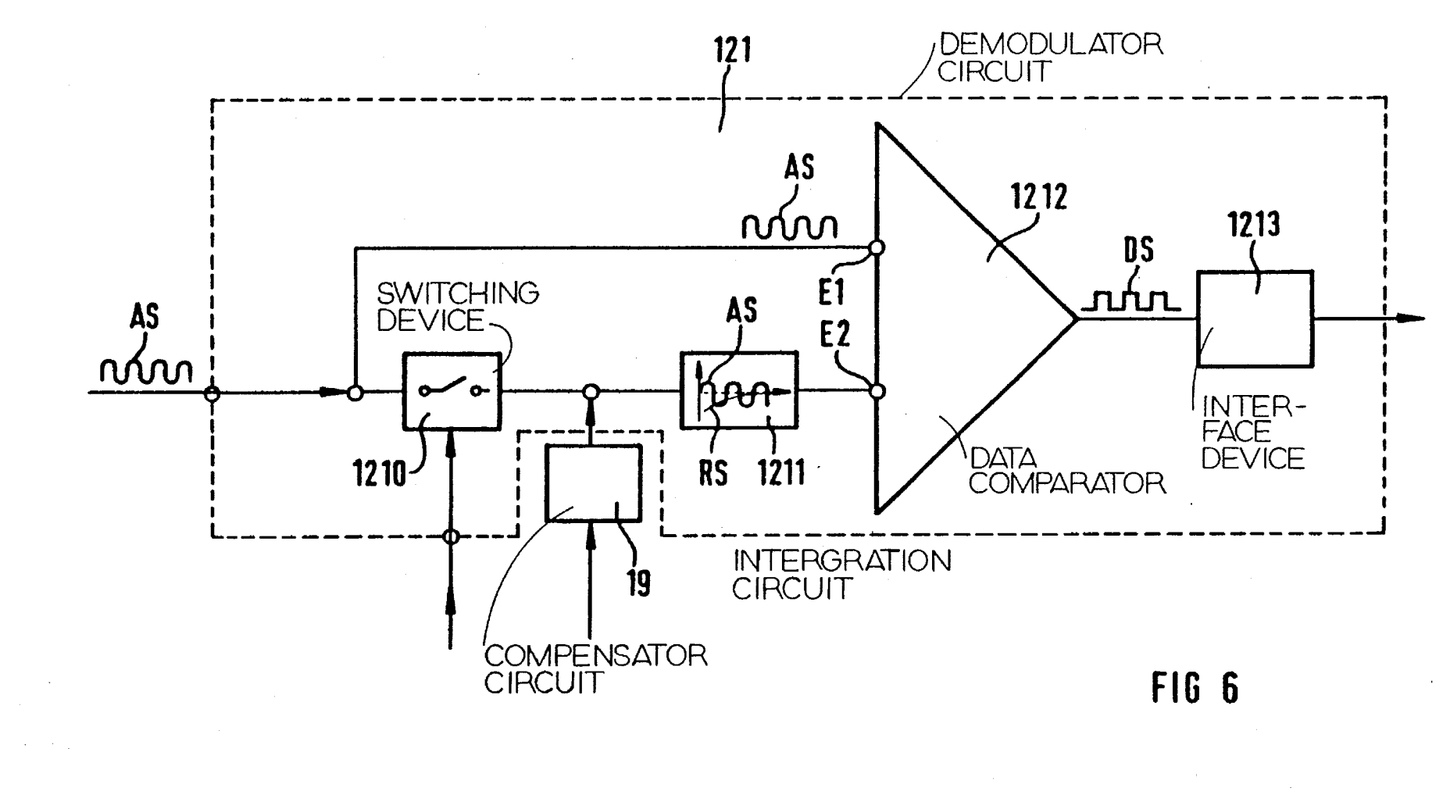
FIG. 6 shows a block diagram of the basic configuration of the receiving section with respect to the demodulation of a modulated analog signal.

FIG. 6 shows the basic configuration of the demodulation circuit 121 with respect to the demodulation of the RF signal AS present at the input of the demodulation circuit 121. From the input of the demodulation circuit 121, the RF signal AS is applied directly to a first input E1 and indirectly via a switching device 1210 and an integration circuit 1211 to a second input E2 of a data comparator 1212. The data comparator 1212 is used in the demodulation circuit 121 as an analog/digital converter for the RF signal AS present at the input of the demodulation circuit 121. For this purpose, the data comparator 1212 is constructed in a familiar manner, especially as integrated chip. To be able to convert the RF signal AS unambiguously and without errors, the data comparator 1212 needs a reference variable which is fixed with respect to the RF signal AS. The reference variable is frequently a reference signal RS which is generated by hardware means in most applications. In the present embodiment, the reference signal RS is generated by the integrator circuit 1211.

Figure 7:
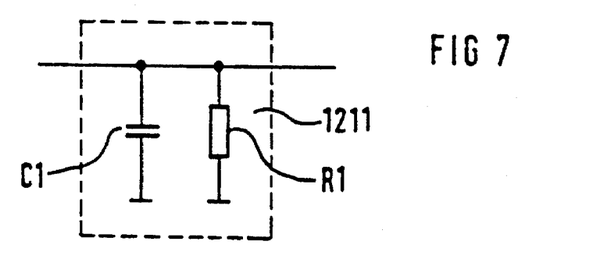
FIG. 7 shows an embodiment of an integrator circuit.

FIG. 7 shows a possible implementation of the integrator circuit 1211, in which a parallel RC circuit consisting of a capacitor C1 and a resistor R1 is connected to ground.

The reference signal RS is needed for the demodulation in order to be able to decide whether an H bit value or a L bit value must be allocated to a signal section of the RF signal AS to be demodulated.

Figure 8:
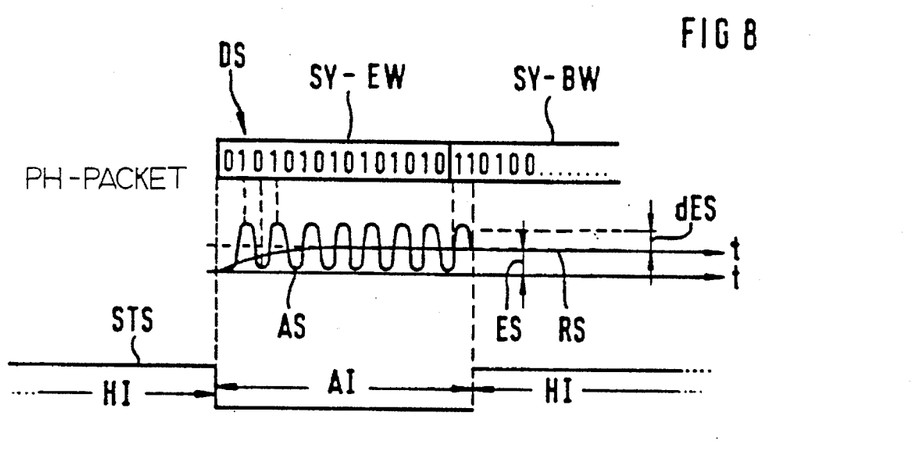
FIG. 8 shows the demodulation of an analog modulated RF signal (carrier signal) using a data comparator.

FIG. 8 illustrates the above problems on the basis of the information relating to FIG. 2 and 4 by means of an error-free signal variation of the RF signal AS.

The modulated RF signal AS present at the input E1 of the data comparator 1212 has the periodic signal variation shown which has no noise and is symmetric to the time axis (t axis). The integrator circuit 1211 preceding the data comparator 1212 at the input E2 forms the reference signal RS. The reference signal RS (charge-up curve on the parallel R1, C2 circuit) assumes its maximum value (settled state) after only a few signal periods of the RF signal AS. The maximum value defines a decision threshold ES which is needed for the demodulation. Using this threshold ES, the data comparator 1212 generates the digital data stream DS from the RF signal AS. In this process, an H bit value is in each case allocated to the positive signal sections of the RF signal AS and a L bit value is in each case allocated to the negative signal sections. Thus, the synchronization initiation word SY-EW is produced from the first 16 signal sections of the RF signal. Using the bit sequence (HLH or, as in the present case, LHL), the definitions specified in FIG. 2 for the directions of transmission allow the originator of the RF signal AS to be determined unambiguously. Two fundamental requirements are set for the reference signals RS for the demodulation of the RF signal AS:

(1) the decision threshold ES must be set within the first 16 signal sections of the RF signal AS, (2) the set value must be maintained during the time slot during the cordless transmission (receiving phase according to FIG. 4).

It follows from these two conditions that, in addition to the demodulation of the RF signal AS, the transition from the synchronization initiation word SY-EW to the synchronization confirmation word SY-BW must also be detected. Using a control signal STS generated by activating the switching device 1210 (switching it on/off), therefore, a sample phase AI and a hold interval HI are generated. The sample phase AI extends over the first 18 signal sections of the RF signal AS. This ensures that the transition (bit 17 and 18 of the data stream DS) is unambiguously detected. This transition is defined by two identical successive bit values in the DECT transmission convention.

With the inclusion of these bit values in the sample phase AI, required on the one hand, the reference signal RS also changes with respect to the decision threshold ES by an error value dES, on the other hand. So that the condition (2) is still met, this error value dES must be compensated for. With reference to the integrator circuit 1211, this means that the integration of the RF signal AS is compensated by a differentiation of the RF signal AS. For this purpose, the compensation circuit 19 is provided which is controlled by the control device 14 in accordance with FIG. 5. The control procedure is explained in the description of FIG. 10.

Figure 9:
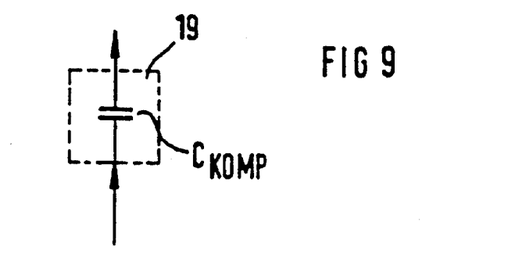
FIG. 9 shows an embodiment of a compensation circuit of the integrator circuit.

FIG. 9 shows possible embodiments of the compensation circuit 19. In its simplest form, the compensation circuit 19 exhibits, for example, a compensation capacitor $C_{COMP}$.

The error value dES is compensated by the compensation capacitor $C_{COMP}$ shown in FIG. 9 in that the energy stored in the compensation capacitor $C_{COMP}$ is applied to the parallel RC circuit R1, C1 in the hold interval HI of the control signal STS when "sampling phase AI changes to hold interval HI".

After the demodulation of the RF signal AS, the digital data stream DS, according to FIG. 6, is applied to an interface device 1213 via which the data stream DS is supplied to the control device 14 according to FIG. 5. The interface device 1213 has the function, inter alia, of decoupling the digital section 13 from the receiving section 10 with respect to the data stream DS to be transmitted.

Figure 10:
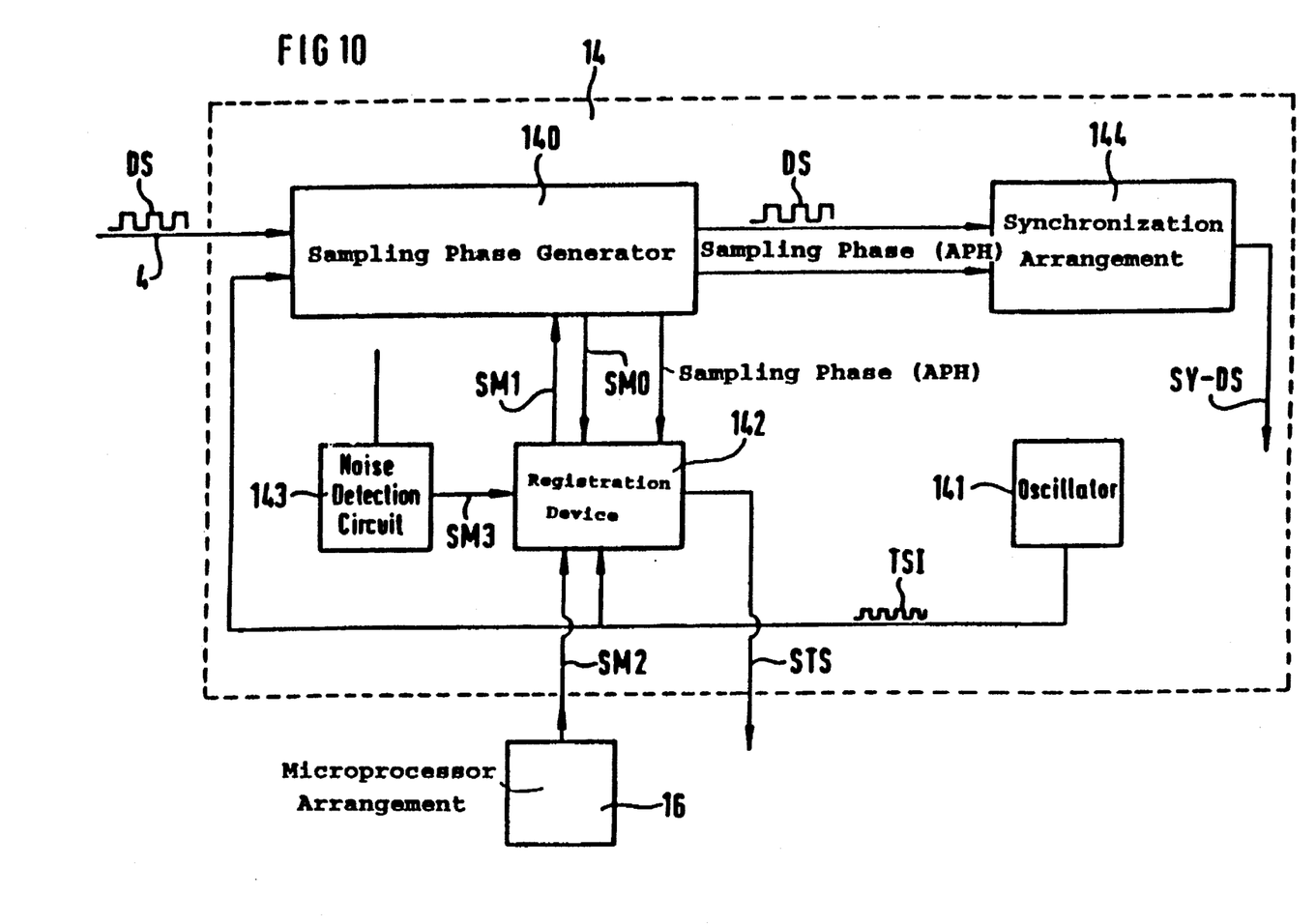
FIG. 10 shows a block diagram of the basic configuration of the digital section with respect to the demodulation of a modulated analog signal.

FIG. 10 shows a block diagram of the basic configuration of the digital section 13 according to FIG. 5 which is required, in particular, for synchronizing the digital data stream DS received by the receiving section 10. For this purpose, the control device 14 exhibits a sample phase generator 140 which is supplied with the digital data stream DS for generating a sampling phase APH. To generate this sampling phase, the sampling phase generator 140 is connected to an oscillator 141, a registration device 142 and a noise detection circuit 143.

The oscillator 141 generates a clock signal TSI, the clock frequency of which is an n-fold multiple of the transmission rate of the digital data stream DS. The clock signal TSI is also supplied to the registration device 142 in addition to the sampling phase generator 140. During the generation of the sampling phase APH, status messages SM0, SM1 are cyclically exchanged between the registration device 142 and the sampling phase generator 140. In addition, the registration device 142 also receives a status message SM2 generated by the microprocessor arrangement 16 of the digital section 13 and a status message SM3 generated by the noise detection circuit 143. From the status messages SM0, SM2, SM3 and the clock signal TSI, the registration device generates the status message SM1 which is supplied to the sampling phase generator 140. The status messages SM0 . . . SM3 are dynamic state messages, changing with time, of the modules 140, 142, 143 arranged in the control device 14 for generating the sampling phase. It should be mentioned at this point that the control device 14 is constructed, for example, as integrated ASIC chip.

When the status message SM1 has been received for the last time, the sampling phase generator 140 generates from the digital data stream and the clock signal TSI the final sampling phase which is then supplied, as well as to the digital data stream DS, to a synchronization arrangement 144 for synchronization. The synchronization arrangement 144 then generates from the digital data stream DS and the sampling phase APH a synchronized digital data stream SY-DS which is then processed further in the control device 14 of the cordless telecommunication apparatus 1. However, the sampling phase APH generated by the sampling phase generator 140 is supplied not only to the synchronization arrangement 144 but also to the registration device 142. Together with the data stream DS also supplied to the registration device 142, the registration device 142 generates the control signal STS which is supplied both to the switching device 1210 and to the compensation circuit 19 of the receiving section 10. On the signal edges of this control signal STS, the switching device 1210, on the one hand, and the compensation circuit 19, on the other hand, are controlled (see description of FIG. 8). Although other modifications and changes may be suggested by those skilled in the art, it is the intention of the inventor to embody within the patent warranted hereon all changes and modifications as reasonably and properly come within the scope of his contribution to the art.

I claim:

1. A cordless telecommunication apparatus, comprising:
    conversion means for converting an analog RF signal into a digital data stream:
        synchronization means for synchronizing the digital data stream with respect to an apparatus clock to produce a synchronized data stream,
        said conversion means comprise comparator means for comparing the analog RF signal with a reference signal generated from the analog RF signal by integration and generate the digital data stream in accordance with a result of the comparison, and
        detection means are provided which, in the case of a first succession of two identical bit values of the synchronized data stream, control said comparator means in such a manner that integration of the analog RF signal is interrupted and integration of RF signal sections corresponding to the two successive bit values is compensated for.

2. A cordless telecommunication apparatus as claimed in claim 1, further comprising:

a switching devices, a compensation circuit, an integration circuit, and wherein said comparator means include an analog/digital comparator which is supplied with the analog RF signal at a first input and via said switching device and said compensation circuit and said integration circuit at a second input, and an output of said comparator is connected to said synchronization means.

3. A cordless telecommunication apparatus as claimed in claim 2, wherein said integration circuit is a parallel RC circuit connected to ground.

4. A cordless telecommunication apparatus as claimed in claim 2, wherein said switching device and said compensation circuit are controlled by said detection means.

5. A cordless telecommunication apparatus as claimed in claim 4, wherein said compensation circuit includes a compensation capacitor.

6. Use of the cordless telecommunication apparatus as claimed in claim 1 as a base station in a Digital enhanced Cordless Telecommunication communication system.

7. Use of the cordless telecommunication apparatus as claimed in claim 1 as a mobile station in a Digital enhanced Cordless Telecommunication communication system.

* * * * *